US006226415B1

(12) United States Patent
Wilson et al.

(10) Patent No.: US 6,226,415 B1
(45) Date of Patent: *May 1, 2001

(54) NOISE REDUCTION IN VOLUME HOLOGRAPHIC MEMORIES

(75) Inventors: Charles L. Wilson, Darnestown; Craig I. Watson, Columbia; Eung Gi Paek, Germantown, all of MD (US)

(73) Assignee: The United States of America as represented by the Secretary of Commerce, Washington, DC (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/070,838

(22) Filed: May 1, 1998

(51) Int. Cl.$^7$ .................................................. G06K 9/40
(52) U.S. Cl. ........................ 382/275; 382/305; 382/210; 359/7; 365/125
(58) Field of Search .................................... 382/210, 254, 382/260, 275, 300, 305; 365/125, 216; 359/7, 1; 369/103; 356/347

(56) References Cited

U.S. PATENT DOCUMENTS

| | | | |
|---|---|---|---|
| 4,655,542 | 4/1987 | Dube | 359/1 |
| 4,663,655 | 5/1987 | Freeman | 348/242 |
| 4,802,109 | 1/1989 | Machida | 708/290 |
| 4,838,644 | 6/1989 | Ochoa et al. | 359/9 |
| 5,337,170 * | 8/1994 | Khoury et al. | 359/7 |
| 5,341,224 * | 8/1994 | Eschbach | 358/456 |
| 5,511,058 | 4/1996 | Visel et al. | 369/103 |
| 5,572,337 * | 11/1996 | Kajitani et al. | 358/461 |
| 5,684,612 * | 11/1997 | Wilde et al. | 359/7 |
| 5,689,351 * | 11/1997 | Hong | 365/216 |
| 5,963,346 * | 10/1999 | Stappaerts | 359/7 |
| 6,118,560 * | 9/2000 | Stappaerts | 359/7 |

OTHER PUBLICATIONS

Demetri Psaltis et al., "Holographic Memories," Scientific American, Nov. 1995, pp. 70–76.
Eung Gi Paek, et al., "Measurements in Optical Information Processing," Nov. 18–21, 1996, pp. 1–27.
C. L. Wilson, "Optical Metrology for Industrialization of Optical Information Processing," NISTIR 6060, Sep. 1997, pp. 1–12.
Bashaw et al. "Crosstalk Control for Multiplex Holography." IEEE NLO 1994, pp. 224–226, Jul. 1994.*
Yeh et al. "Hologram Restoration and Enhancement in Photorefractive Media." IEEE NLO 1994, pp. 421–423, Jul. 1994.*

* cited by examiner

Primary Examiner—Jon Chang
(74) Attorney, Agent, or Firm—Millen White Zelano & Branigan

(57) ABSTRACT

A method for improving the quality of holographic images by reducing local noise in a holographic memory system is disclosed. The method is characterized by: storing a white reference image and a black reference image in the memory system, storing a series of data images in the memory system, applying a simple model based on a point-to-point of linear interpolation to the series of data images, the white reference image and the black reference image to provide a series of corrected data images having reduced noise. The simple model is preferably in the form of $$s(x, y) = \frac{I(x, y) - I_{\min}(x, y)}{I_{\max}(x, y) - I_{\min}(x, y)} (s_{\max}(x, y) - s_{\min}(x, y)),$$

which is characterized by temporal stability for the series of data images for each set of the black and white reference images.

19 Claims, 7 Drawing Sheets

NOISE REDUCTION IN VOLUME HOLOGRAPHIC MEMORIES

BACKGROUND OF THE INVENTION

1. Field of the Invention

The present invention relates to a method of reducing local noise in holographic images stored in volume holographic memories.

2. Related Art

Recent extensive results at various places have shown that holographic memory has a great potential for a future memory with large storage capacity of one trillion bits per cubic centimeters and fast random access of approximately one million pages per second.

However, an image reconstructed from a holographic memory is significantly degraded by various interference fringes originating from dust on optical components, unwanted reflection from various surfaces, etc. As a result, signal-to-noise ratio (SNR) and storage capacity of a holographic memory is greatly reduced, posing a serious bottleneck in the practical use of holographic memory.

Although, there have been approaches suggested to reduce the coherent noise, most of them are either impractically complicated, poor in performance, or time-consuming. Furthermore, most of this previous work did not consider noise from SLMs (Spatial Light Modulators) or CCDs (Charge Couple Devices).

SUMMARY OF THE INVENTION

It is an object of this invention to provide a method for reducing local noise in a holographic memory system.

It is an object of this invention to provide a method for reducing local from the SLM and the CCD in a holographic memory system.

It is yet another object of this invention is to provide an improved method for reducing local noise in a holographic memory system.

The invention according to a preferred embodiment provides a method for reducing local noise in holographic images stored in a holographic memory system by: storing a white reference image and a black reference image in a holographic memory system, storing a series of data images in said memory system, and applying a simple model based on a point-to-point method of linear interpolation to the series of data images, the black reference image and the white reference image to provide a series of corrected data images having reduced noise. The simple model is preferably in the form of $$s(x, y) = \frac{I(x, y) - I_{min}(x, y)}{I_{max}(x, y) - I_{min}(x, y)} (s_{max}(x, y) - s_{min}(x, y)), \quad (1)$$

which has temporal stability for a plurality of data images for each set of the black and white reference images.

Upon further study of the specification and appended claims, further objects and advantages of this invention will become apparent to those skilled in the art.

BRIEF DESCRIPTION OF THE DRAWINGS

FIGS. 3a–3c show experimental results of image improvement using the simple model.

DESCRIPTION OF THE PREFERRED EMBODIMENTS

Figure 1:
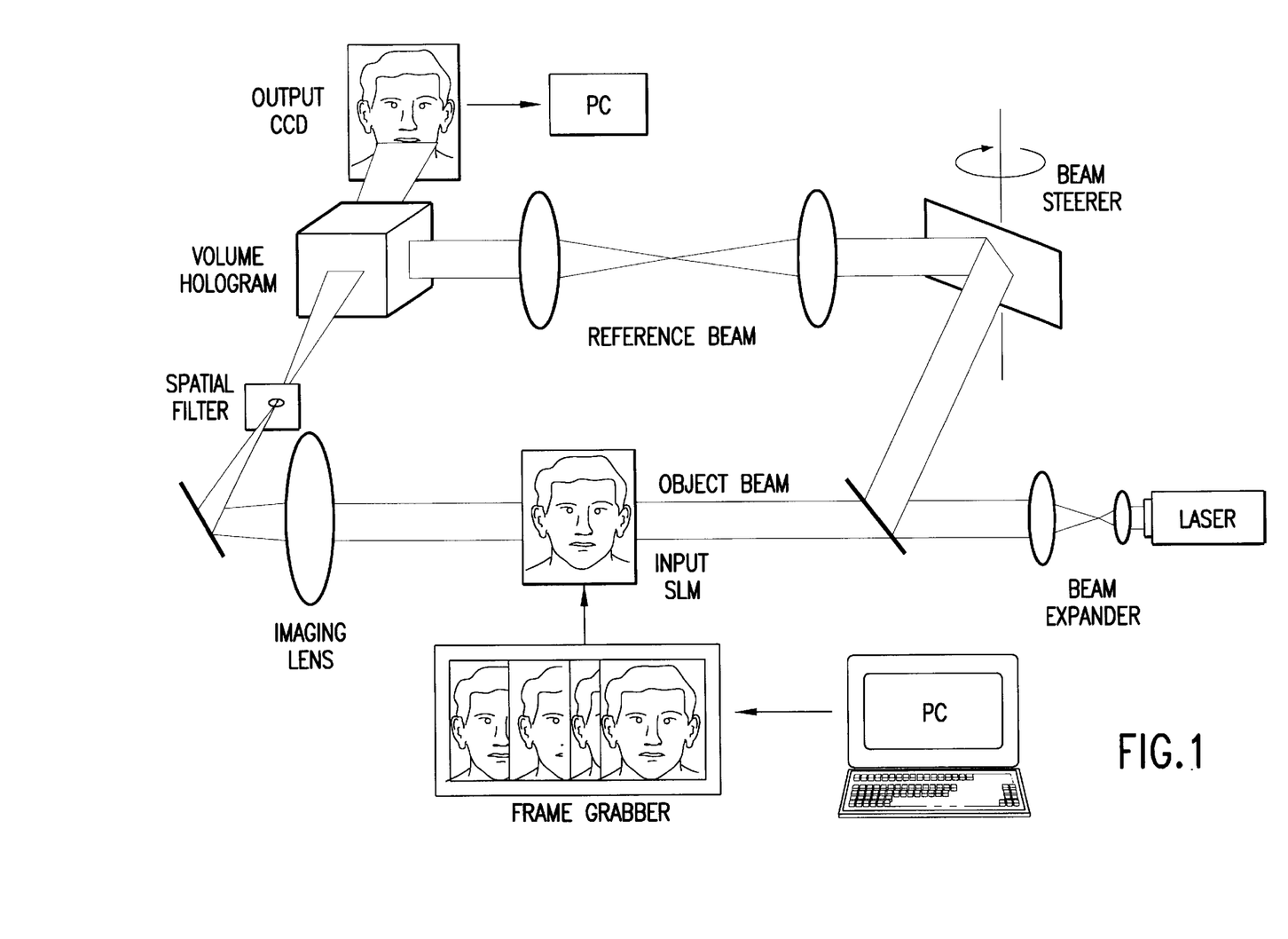
FIG. 1 shows a schematic diagram of a volume holographic system.

FIG. 1 shows a schematic diagram of a volume holographic system to which the invention can be applied. The light from a laser of 0.2 watt frequency-doubled Nd:YAG laser of green color in 532 nm frequency is expanded by a beam expander which consists of two lenses, and is divided by a polarizing beam splitter into an object beam and a reference beam. The object beam is modulated by an input image loaded on an SLM (spatial light modulator) through a frame grabber of a data input computer. The input image is Fourier transformed at the focal plane of a lens. At the focal plane, a spatial filter is placed to remove the grid structure of the SLM. The spatial filter also is used to reduce the serious image degradation due to Moiré fringes that occur when a SLM is imaged onto a CCD. The reference beam is steered to the desired direction by a mirror mounted on a mechanical beam steerer. The mechanical beam steerer can be replaced by an electro-optic or acousto-optic beam deflector for faster beam steering. To keep the same position of the reference beam at the recording material for different beam angles, a telescopic imaging system is employed.

A volume holographic recording material (an iron-doped lithium niobate photorefractive crystal) is placed at the intersection of the both reference beam and object beams to record the interference fringes. Each page of information is recorded by a difference reference beam angle using the angular multiplexing technique. For readout, the reference beam is steered to the desired angle to retrieve the corresponding image on a 2-D CCD detector array.

The SLM used is an electrically addressable AMLCD (Active Matrix Liquid Crystal Device) with 640 by 480 pixels in a half-inch diagonal active area.

Holograms are recorded in a LiNbO3 crystal which shows reasonably good uniformity and low scattering noise. Up to 1000 images are recorded at 0.02 degree increments in the reference beam angle. Image quality is good enough to recognize persons without any difficulty. The details of the optical memory system can be found in Wilson et al.'s "Optical Metrology for industrialization of Optical Information Processing," NISTIR 6060, National Institute of Standards and Technology, September, 1997, and a slide presentation titled "Measurements in Optical Information Processing," Invited Talk at IEEE LEOS '96, Nov. 18–21, 1996, the disclosures of which are hereby incorporated as reference.

Through a series of extensive holographic recording and readout processes, noise sources are identified as follows:
a) Dominant noise sources are SLMs and CCDs. The interference fringes due to multiple reflection from glass substrates or polarizers in an SLM, diffraction pattern from a CCD, or dust or defects on these components are main sources of noise.

b) The noises from SLMs and CCDs are "local", which, not affected by other pixels, because SLMs and CCDs are located at conjugate planes with each other. Therefore, dust or one portion of an interference fringe does not affect other parts.
c) The above noises are almost independent of surrounding signals. In other words, the noise at one pixel is not affected by signals at other pixels of an SLM.
d) Most of the global noises are due to speckle noise from components located at non-conjugate planes of the CCD. These noises are normally weaker than local noise and can be removed by careful handling and cleaning of components.
e) Non-uniform illumination of an SLM can also be considered a local noise.

Figure 2:
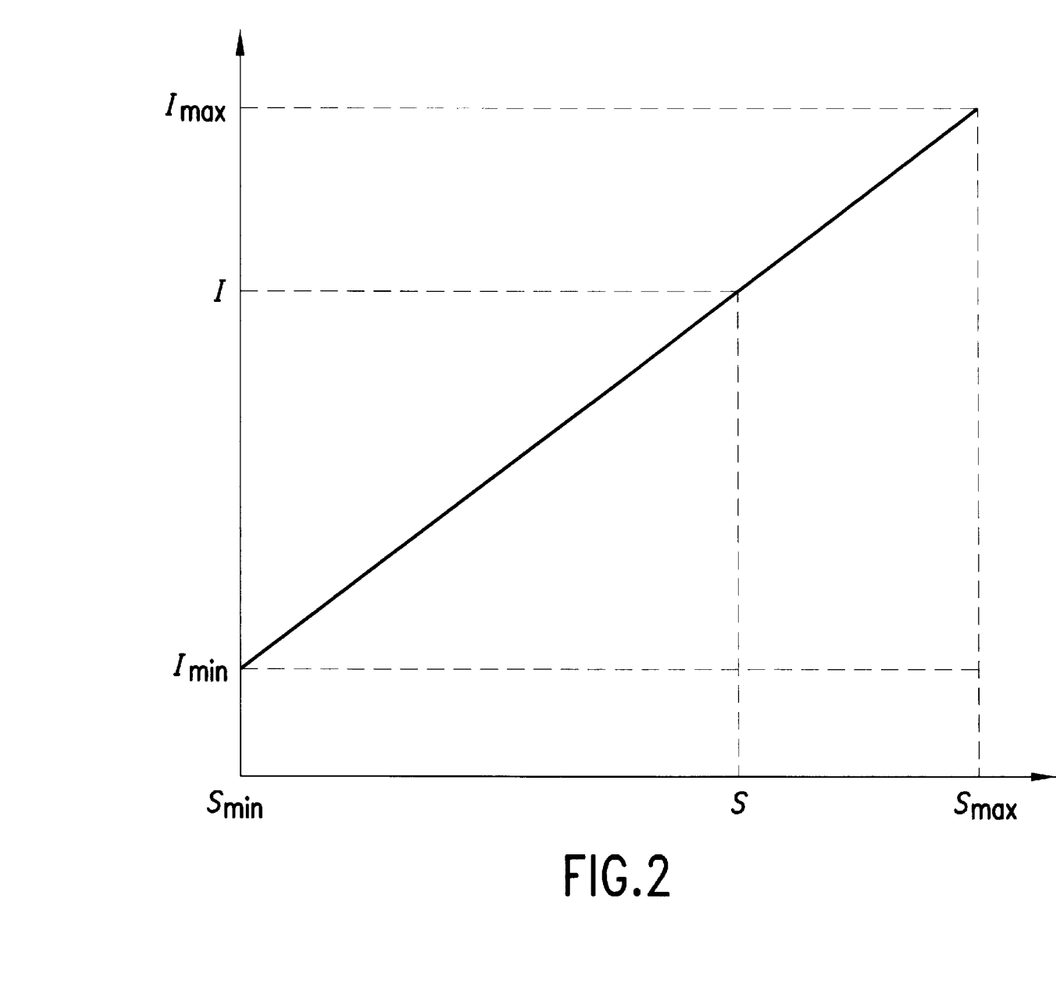
FIG. 2 shows a simple model of linear interpolation to improve holographic images.

To reduce local noise in the holographic memory system, the following point-to-point method for reducing the noise is provided by the invention. As shown in FIG. 2, it is a simple linear interpolation and can be described as follows:

$$s(x, y) = \frac{I(x, y) - I_{\min}(x, y)}{I_{\max}(x, y) - I_{\min}(x, y)} (s_{\max}(x, y) - s_{\min}(x, y)), \quad (1)$$

where s and I represent a signal and a CCD output, and $S_{min}$ and $S_{max}$ are typically 0 and 255, respectively. Also, $I_{min}$, and $I_{max}$ represent measured CCD outputs for the given $S_{min}$, and $S_{max}$, respectively and is independent of images. Therefore, once these two variables are measured in addition to image-specific value I, the correct single scan be estimated using the above formula for each pixel.

$S_{max}$ may have other values depending on the grayscale levels that the system is capable of generating. In this present system, there are 256 grayscale levels with values between 0 and 255 for black and white, respectively.

A point-to-point method is one in which the above-mentioned simple model is applied to each (x,y) pixel or point by itself and not taking neighboring pixels or points into consideration.

One should note that the model requires only intensity information and does not require phase information that is difficult to measure and is unstable. This fact facilitates measurements and increase robustness of the model. More importantly, the model requires only local information, allowing fast, simple and inexpensive implementations.

The holographic recording and readout process based on the model can be divided into two stages: post-processing and pre-processing.

In post-processing, each image is recorded with two extra reference images, an all minimum signals (s=0) and an all maximum signal (s=255) over all the SLM pixels. These two reference images provide $I_{min.}$ and $I_{max}$ values for all pixels when calculating the real signal values according to equation (1). These values represent a noise pattern and are image-independent.

One should note that each image, group of images, or series of images recorded in a hologram should match the corresponding reference images for successful noise reduction. In other words, both an original image or group of original images, and the corresponding reference image pair should be recorded exactly at the same condition. For instance, air turbulence or thermal effects can cause changes in interference fringes inside an SLM, resulting in a mismatch. To avoid the mismatch, the reference images need to be updated before any changes in noise interference fringes occur. Typically, the noise patterns are stable over a long period of time (more than an hour), if the system is well covered from air turbulence. This means that the reference images need to be updated every hour during the recording process.

Temporal stabilization is a condition in which multiple data images can be matched with corresponding reference images and in which the multiple data images can successfully achieve noise reduction with the reference images using the simple model.

In pre-processing, the signal to be loaded in an SLM is pre-calculated on a computer with noise patterns taken into consideration. Alternatively, one can use an extra SLM in contact with the main one to compensate for the noise. In these cases, noise patterns still need to be constantly measured and monitored.

Experimental Demonstration of the Simple Model

Figure 3A:
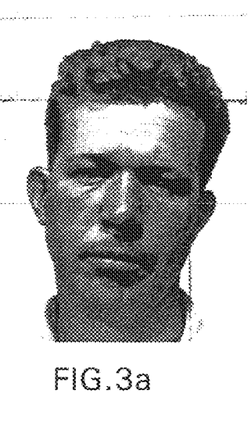
FIG. 3a shows an original image.
Figure 3B:
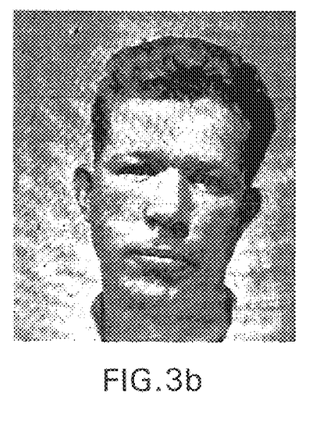
FIG. 3b shows a raw image from a holographic storage.
Figure 3C:
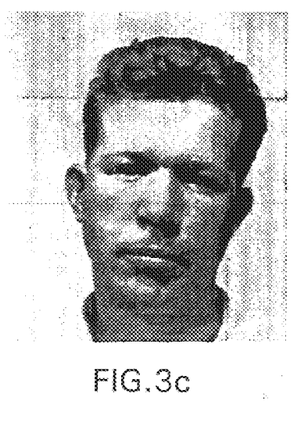
FIG. 3c shows a corrected image obtained after processing using the simple model.

Simple as it is, the model works well for reducing noise in holographic memories, as is illustrated in FIG. 3. FIG. 3 (a) shows an original image, (b) shows a raw image contained from a holographic memory, and (c) shows the image processed using the simple model. One can see that the spurious interference fringes in the raw holographic images have been significantly removed in (c).

Such a significant improvement in image quality can be obtained reproducibly for all the randomly selected images using the simple model. This demonstrates the broad applicability of the model, and particularly for faces. Other possible data images include, but not limited to, finger prints, retina scans, and DNA "finger prints".

A Simulation of the Simple Model

Figure 4:
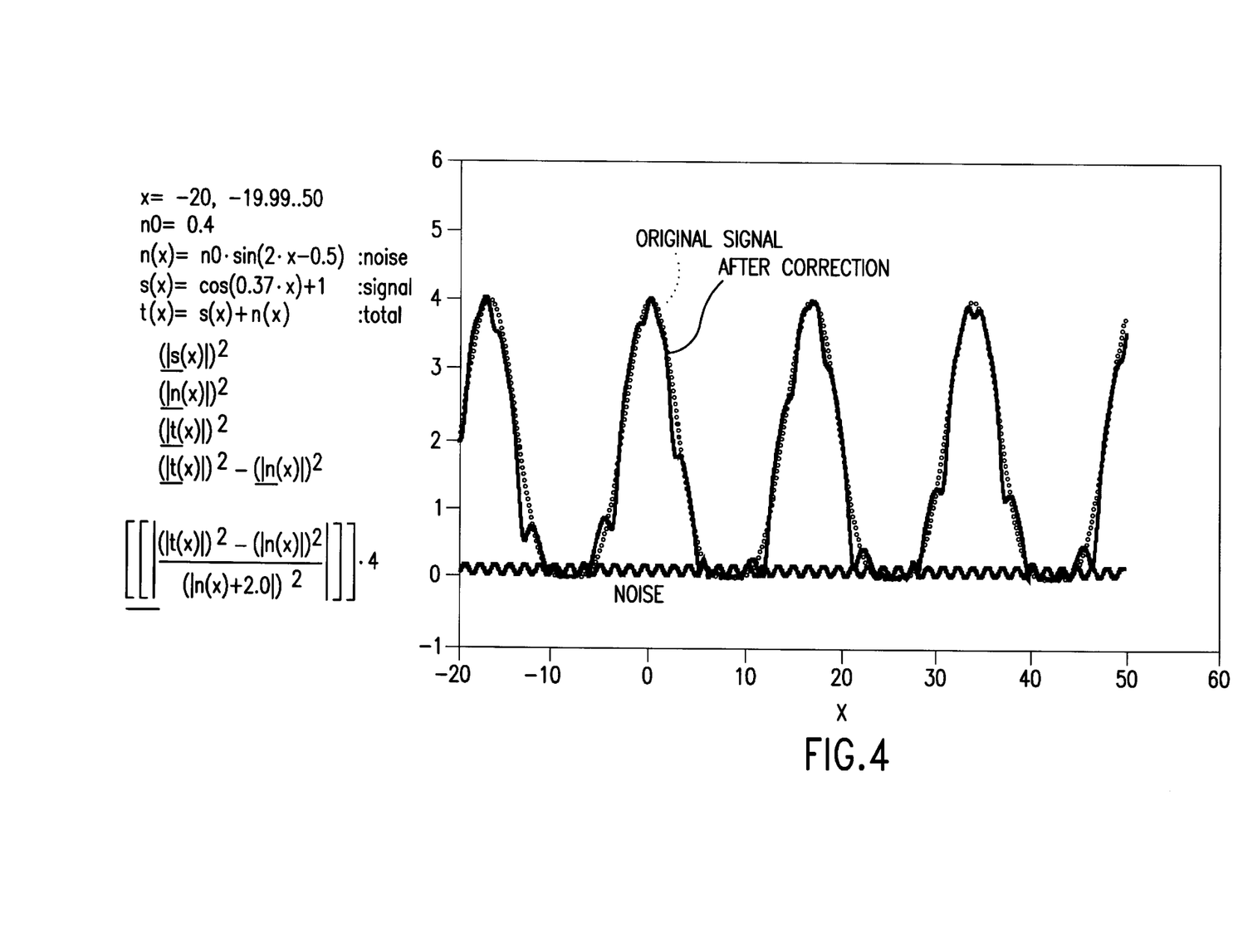
FIG. 4 shows a simulation of the simple model.

To better understand why the model works so well for a coherent system, a simple simulation is performed as in FIG. 4.

In the figure, the fine-dotted line, the gray solid line, the gray coarse-dotted line and the solid line represent original signal, noise, a raw signal before correction and signal after correction using the simple model, respectively. The signal before correction (corresponding to a raw image from a holographic memory) shows strong interference fringes as a result of "coherent" addition of the original signal and the noise. In contrast, the signal after correction is free from the strong interference fringes except minor ripples and follows the original signal faithfully. This simulation result explains how the simple model works even for a coherent system.

Since the model requires only local information, the processing speed is very fast and hardware implementation can be done in an inexpensive and simple way. One should note that most of the other image processing algorithms are based on convolution or correlation that require a significant amount of computational time because extensive global calculations are required.

Linearity of CCD Output vs. SLM Input

In the simple model, it is assumed that the CCD output increases linearly as the SLM input signal increases, as shown in FIG. 2. However, in real cases, CCD output is not linear, as is shown in the experimental results in FIG. 5. In the Figure, each curve was obtained for a randomly but uniformly chosen pixel in the CCD. At each selected pixel, CCD outputs were measured for various SLM input values. All the curves in this Figure show a similar tendency: a slow increase at low light level and gradual increase in grain at higher signals.

Figure 5:
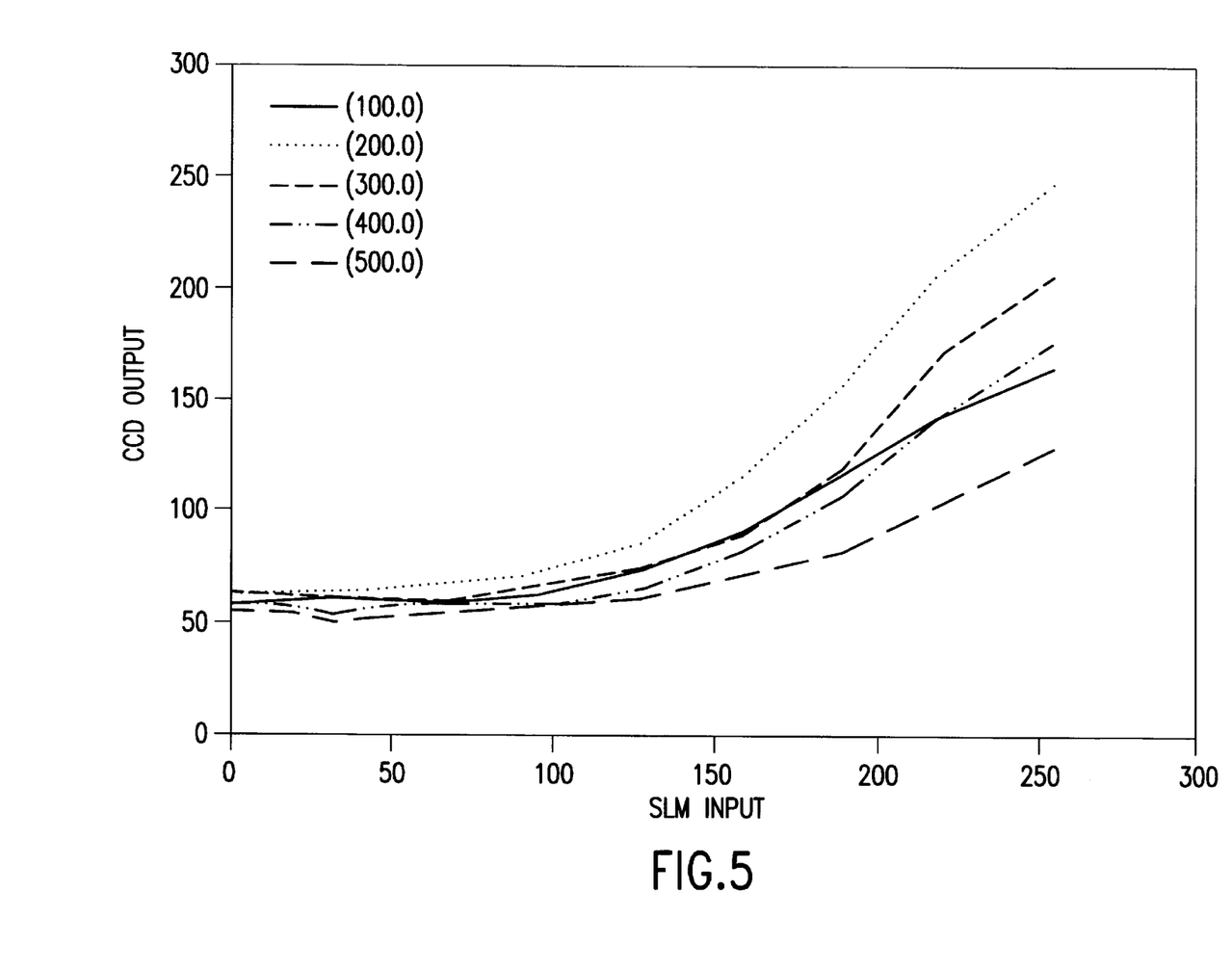
FIG. 5 shows the relationship between CCD outputs and SLM inputs.

The nonlinearity of the response curve can be compensated as follows:
a) Gain and bias (or exposure time in case of a digital CCD) of a CCD or intensity of the light source can be adjusted so that the levels for the given signal range (0–255) can be within the linear region of the CCD. Although simultaneous adjustment for all different pixels into the linear region may be difficult because intensity of the noise pattern varies over a broad range, a reasonable amount of linearity can be obtained.

b) If a satisfactory linearity cannot be met, a variation of the model such as quadratic or sigmoidal model or even a look-up-table can be considered. The cost of table base gain compensation computation will be comparable to computation of equation (1). Fortunately, the curves shown in FIG. 5 show monotonic increase with respect to SLM input, implying one-on-one correspondence between SLM input and CCD output. Therefore, the SLM input signal can be uniquely determined with the accuracy that is determined by the dynamic range of a CCD.

Locality of Noise

Figure 6:
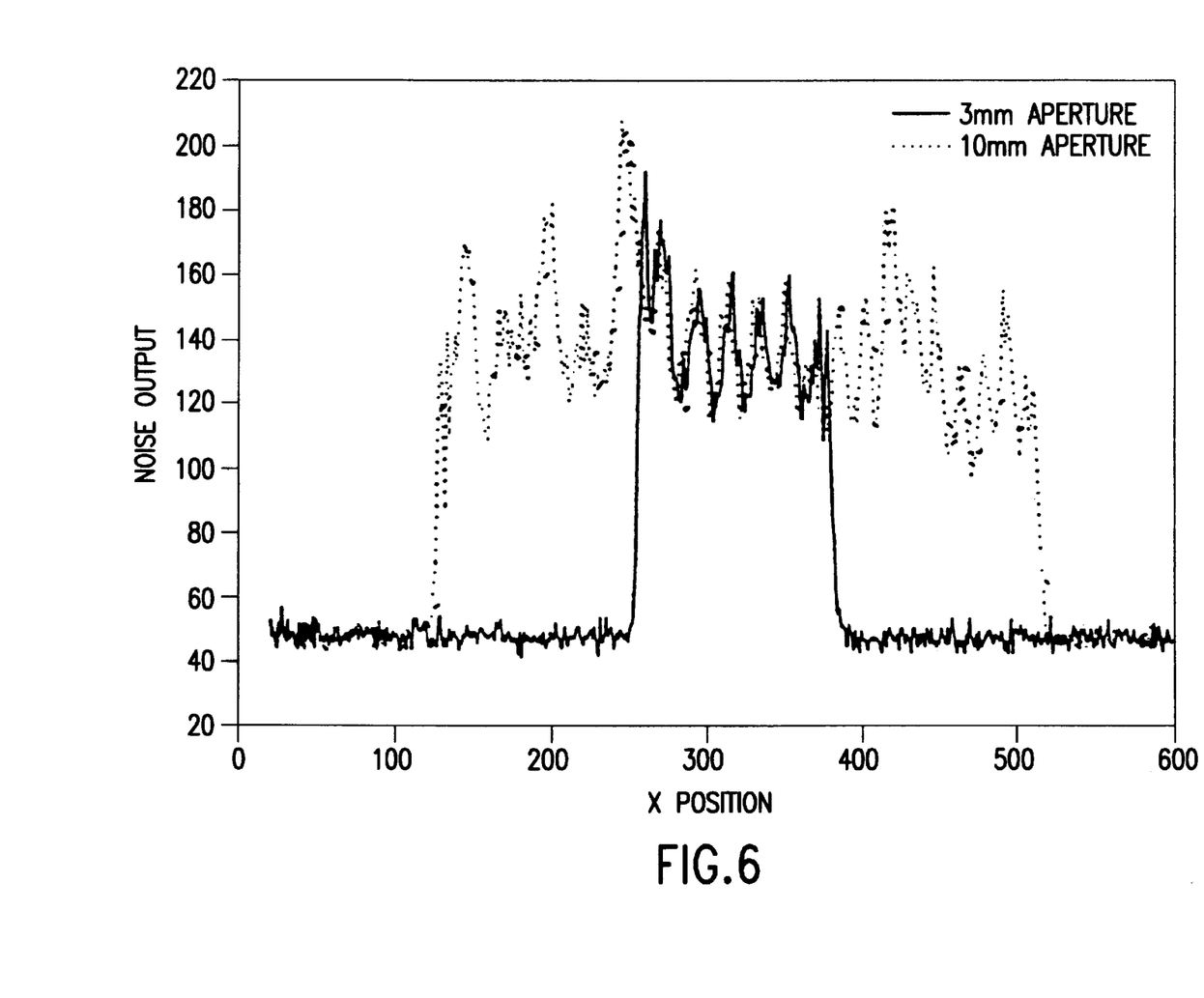
FIG. 6 shows noise output for various aperture size of an SLM.

In the simple model, it is assumed that the dominant local noise at one point in the output plan is not be affected by other at other points. To prove this experimentally, a circular iris with adjustment aperture size is positioned very close to an SLM and the noise output pattern is scanned along one direction by a CCD. No signal is applied to the SLM. The solid line in FIG. 6 shows a CCD scan output for the iris with 3 mm aperture and the dotted line shows a result for a concentric 10 mm aperture. As show in the Figure, the noise through 3 mm aperture is not noticeably affected by extra noise through the annual ring (3 mm–10 mm) aperture, except diffraction at the edge of the aperture. This result supports the assumption of locality of major noise used in this model.

Figure 7:
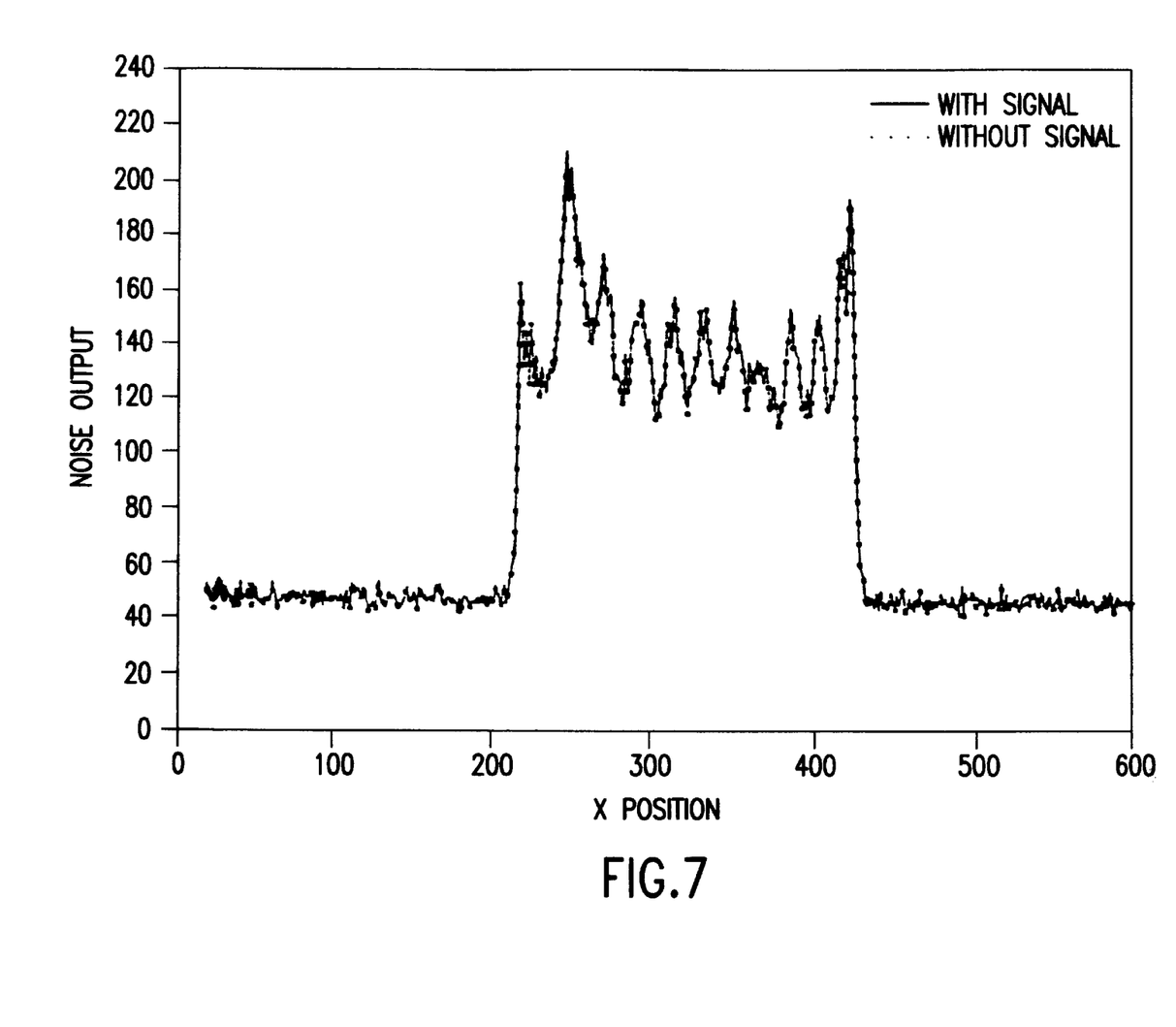
FIG. 7 shows noise output with and without surrounding signals.

Also, to investigate whether a signal at one point of an SLM affects noise outputs at other points (non-conjugate points of the particular point in an SLM) of a CCD, the noise output is scanned along a line with and without surrounding signals, as in FIG. 7. The dotted line shows noise output without surrounding signals and the solid line shows result with surrounding signals which are located off the pixels along scan line. It is clear that surrounding signals do not affect noise output, unless signal level is too high and causes blooming effect in the CCD. The two results shown in FIGS. 6 and 7 show clear locality of noise output with respect to other signals and noise.

Spatial Observation Models

The above-disclosed simple model is based on an original basic linear mapping model, which is equation (5) and Model I below. The original linear model uses multiplicative and additive noise images. If the multiplicative gain image is W(m, n) and the additive bias image is B(m, n) then the observed output image V(m, n) is obtained from input U(m, n) thus:

$$V(m,n) = W(m, n)U(m, n) + B(m, n) \quad (1a)$$

Clearly an appropriate restored version of the input image is obtained by inversion of the model:

$$U'(m, n) = \frac{V(m, n) - B(m, n)}{W(m, n)} \quad (2)$$

where all arithmetic is done as point operations. One method of quickly deriving the W and B images is to compute them from two points, specifically the points obtained for uniformly black $I(m, n)=0$, $\forall(m, n)$ and uniformly white $I(m, n)=255$, $\forall(m, n)$ test case inputs:

$$V_b(m, n)=0 \ W(m, n)+B(m, n)=B(m, n) \quad (3)$$

$$V_w(m, n)=255 \ W(m, n)=B(m, n) \quad (4)$$

whence the linear model 1 a becomes $$V(m, n) = \frac{V_w(m, n) - V_b(m, n)}{255} U(m, n) + V_b(m, n) \quad (5)$$

Note that in previous data sets the black response $V_b(m, n)$ has been small compared to the white response such that the equation effectively is approximated by $V(m, n)=V_w(m, n)/255$ which is closely the original correction we considered. The value 255 represent the number of available grayscale levels between a white image and a black image in a system. This value may vary depending on the system's ability to generate grayscale levels. Thus, 255 may be replaced by a constant K represent a value for grayscale levels. Equation (5) then can be read as:

$$V(m, n) = \frac{V_w(m, n) - V_b(m, n)}{K} U(m, n) + V_b(m, n) \quad (5)$$

New Models

In addition to the above-described simple model, which is derived from the linear mapping model (Model I in the table below), it is desirable to create other models that are more exact in reflecting the various physical processes that are present in the holographic memory system.

A more general approach is to specify a model of the process and, using test input and output images, to minimize some error mapping function thereby fitting some parameters. Seven new models, A–G, were analyzed:

|  |  |  |  |  |  |  |
|---|---|---|---|---|---|---|
| Model I |  | G(m, n))U(m, n) | (W(m, n) − B(m, n))/255 |  | + B(m, n) |  |
| Model A |  | a(G(m, n)U(m, n))$^b$ |  | + cW(m, n)$^d$ |  | + e |
| Model B |  | a(G(m, n)U(m, n))$^b$ |  | + cW(m, n) | + dB(m, n) | + e |
| Model C | V(m, n) = | a(G(m, n)U(m, n))$^b$ | W(m, n) |  | + dB(m, n) | + e |
| Model D |  | a(G(m, n)U(m, n))$^b$ | (W(m, n) − B(m, n)) |  | + dB(m, n) | + e |
| Model E |  | a(G(m, n)U(m, n)) | W(m, n) |  | + dB(m, n) | + e |
| Model F |  | a(G(m, n)U(m, n)) | W(m, n) |  | + dB(m, n) |  |
| Model G |  | a(G(m, n)U(m, n)) | W(m, n) |  | + B(m, n) |  | where the function G(x, y), or G(m, n), represents the light intensity variation of the laser beam normal to its direction of propagation, and had been modeled as a separate elliptical Gaussian multiplicative term applied to the SLM input image. It is parameterized by $\sigma_x$ and $\sigma_y$.

$$G(x, y) = \exp-\frac{x^2}{2\sigma_x^2}\exp-\frac{y^2}{2\sigma_y^2} \qquad (7)$$

where

W/2≦x≦W/2, W=525, $\sigma_x$=0.6W and
H/2≦y≦H/2, H=375, $\sigma_y$=0.6H.

Note that G(x, y) and G(m, n) are equivalent; and, (x, y) and (m, n), which denote a point in Cartesian coordinate system, can be used interchangeably.

The scalar quantities a, b, c, d e and optionally (and maybe separately) $\sigma_x$ and $\sigma_y$ are to be estimated from the data. The pair (a, b) pair models the nonlinear attenuation of the spatial light modulator. This effect is assumed to be spatially invariant, and dependent only on the uniform properties of the nemetic crystal compound.

The variables (c, d, e) represent the remainder of the optical bench: the parameter c is merely a multiplier for the bias noise image and, in the case where B(m, n) is derived empirically according to equation 3, should be close to unity; in the second model d is likewise a scale factor, whereas in the first it is an attenuation factor. The final parameter, e is just a scalar offset term applied to the whole image, that could represent a CCD noise bias. The degree to which the models represent actual physical properties of the bench is varied; the third model is probably most accurate, the first one the least. In all cases the variable e suggests some output for no input, and therefore would be expected to be zero.

A more problematic effect is the presence of fringes in the output due to diffraction effects throughout the system. Particularly the SLM seems to have non parallel surfaces that cause one set of fringes. Two approaches to handling these effects are possible: firstly obtain the fringe pattern empirically from observations, which is the approach taken so far by using coherent averaging of the uniform black and white response images; or secondly by obtaining a function analytically from the wave optics of the system. In both cases the fringes would be incorporated into the model with weights to be determined empirically.

Fitting Metrics

To obtain sets of fitted parameters of the various models, the signal to noise ratio is used as described below. One can reasonably use the root mean square difference between the observed and computed output images:

$$E(V', V) = \frac{1}{MN}\sum_{mn}^{MN}(V^1(m, n) - V(m, n))^{2\frac{1}{2}} \qquad (8)$$

However if one wants to optimize this metric over a set of heterogeneous image pairs then the signal to noise ratio of each is more meaningful. Specifically the fitting process involves maximization of:

$$SNR = -10\log\frac{\sigma^2 \text{observed}}{\sigma^2 \text{error}} \qquad (9)$$

$$= -10\log\frac{\sum_{mn}(V(m, n) - \overline{V(m, n)}^2}{MN\;\overline{E}^2}$$

where $\overline{x}$ indicates the scalar spatial mean. The fitting process has not, thus far, been applied to multiple input-output pairs because the exposure schedule correction (see Holographic Memory Calibration section) has not yet been applied.

A gradientless multivariate quasi Newton method is used to optimize the SNR for each model in equation 6 over the variable a, b, c, d and e. The variables $\sigma_x$, $\sigma_y$ were optionally held constant during the optimization, or optimized independently later.

Data

The input patterns consist of thirty three sets of three images: a uniform black image, a face image, and a uniform white image. There are thirty three face images in total. Each one obtained from the mugshot database has size

TABLE 1

Estimated parameters of the spatial degradation models

| Model | $\sigma_x$ | $\sigma_y$ | a × 10³ | b | c | d | e | RMS |
|---|---|---|---|---|---|---|---|---|
| A | ∞ | ∞ | 0.075 | 2.352 | 0.257 | 1.193 | −1.425 | 9.166 |
| B | ∞ | ∞ | 0.023 | 2.533 | 0.318 | 0.535 | −0.344 | 8.308 |
| C | ∞ | ∞ | 0.221 | 1.456 | | 0.725 | −0.019 | 5.034 |
| D | ∞ | ∞ | 0.018 | 2.034 | | 0.921 | 0.007 | 5.238 |
| E | ∞ | ∞ | 3.272 | | | 0.588 | −5.666 | 5.256 |
| F | ∞ | ∞ | 3.041 | | | 0.525 | | 5.469 |
| G | ∞ | ∞ | 1.390 | | | | | 9.675 |
| C | 1.25 | 1.26 | 0.078 | 1.66 | | 0.766 | −0.015 | 4.951 |

600×480 with resolution of 500 dpi.

A data set contains the images obtained by reading each of ninety nine stored images twenty four times. The images have size 525×375 which is smaller than the original input images. This decrease in resolution stems from at least two sources: firstly the image is clipped by a physical mask just after the plane of the SLM which trims mostly the left and top edges of the images; secondly the effects of colimation lenses and specific CCD array all produce an image changed in size and in aspect ratio.

These effects are emulated by cutting a subimage of constant size (566, 465) and fixed location (29, 15) from all the raw face images and applying a Fourier domain size reduction (or enlargement) technique. This yields face images of very high quality and the same size as the measured output images. This localization and geometric modeling may well need a better description.

Given that there is little trend in the rms signal during these readings, and that the images are very well spatially registered, the twenty four copies of each image are averaged to form a noise-reduction aggregate (random additive noise is reduced by coherent averaging). These versions of the image were used for fitting the parameters of the model.

The trial used a very small set of images, and which is clearly a variable in need of expansion. However that task requires adjustments to image intensities to be made to compensate for the inaccurate storage schedule, discussed in section 3.

Holographic Memory Calibration

The time dependent exponential term in equation 6 refers to the process associated with storing the images in the holographic crystal. The amplitude in the crystal of the $m^{th}$ stored images is $A_m$ and is related to its exposure time $t_m$, the cumulative erasure effects of subsequent images and the time constants of the photorefractive media $\tau_r$ and $\tau_e$ by $$A_m = A_s(1 - \exp(-t_m/\tau_r))\exp-\sum_{n=m+1}^{M}t_n/\tau_e \qquad (10)$$

where $A_s$ is the saturation amplitude. An exposure schedule can adjust the exposure time according to:

$$t_m = \frac{t_o}{1+(m-1)t_o/t_d} \tag{11}$$

where $0 \leq m \leq M-1$ is the exposure sequence index of the M images, $t_o$ is the first exposure time, and $t_d$ is a constant related to $\tau_e$ in the equation 10 above, and has been set to 1250 thus far. The intention of using such a schedule is typically to obtain that $A_m = A_{m+1}$ $\forall m$, however the next graph below indicates that we have not achieved this, the problem lying in the parameterization of the schedule.

The graph shows the mean pixel (i.e. over all pixels) rms intensity for the thirty three black, face, white triplets stored in and then retrieved from the crystal. The value shown is the mean over the twenty four read passes; the error bar has length of two standard deviations measured over the same twenty four reads. The intensity measured during over those reads (spanning about an hour) appears to have no trend.

The data for any particular read epoch also contains what should probably be regarded as outlier images; typically those images that are very dark given the input; apparently resulting from mirror misalignment and consequent bad addressing of the hologram.

Given equation 10, the scheduled times $t_m$ and the measured intensities $I_m$ (which we assume will be proportional to $A^2_m$), the parameters $A_s$, $\tau_e$, $\tau_r$ can be estimated by fitting the model to the data. This process yields $A_s=13.2$, $\tau_r=17.0_8$ and $\tau_e=5160_s$ with rms error on the 99 data points of 12.6. Clearly these estimates obey the desired behaviour of $\tau_e >> \tau_r$. If this process is achieved accurately then a recording exposure schedule, $t_m$, can be found that will finally give a uniform amplitude of the M images in the crystal. One method obtains a new schedule using a reversal solution:

The stored amplitude of the last image, exposed for a suitable user specified time $T=t_M$, will be $$A_m = A_s(1-\exp(-T/\tau_r)) \tag{12}$$

Requiring then that $A_{M-1} = A_M$, equation 10

$$A_{M-1} = A_s(1-\exp(-t_{m-1}/\tau_r))\exp(-T/\tau_e) = A_s(1-\exp(-T/\tau_r)) \tag{13}$$

is used to obtain $$t_{M-1} = -\tau_r \log 1 - \frac{1-\exp(-T/\tau_r)}{\exp(-T/\tau_e)} \tag{14}$$

The corresponding equation for exposure of the $k^{th}$ previous recording is then $$t_{M-k} = -\tau_r \log 1 - \frac{1-\exp(-T/\tau_r)}{\exp\left(\sum_{n=M-k+1}^{M} -t_n/\tau_e\right)} \tag{15}$$

which applies for all images in the sequence: $1 \leq k$ M-1.

Equation 10 does not itself reference the image intensities, rather it has just been asserted that the observed image intensity, measured at the CCD, can be described simply as being proportional to $A^2_m$, which are themselves only dependent on the physical constants of the electro-optic medium, and the exposure durations. A better model is likely necessary. The functional form of the best of the spatial models in equation 6 augmented with $A^2_m$ should probably be used in scalar form. For demonstration purposes, Model E is embedded; thus:

$$V_m = \alpha + \beta A^2_m(\gamma U_m + 1) \tag{16}$$

where all the quantities are scalars, $V_m$ is the rms image intensity measured at the CCD, $U_m$ is the rms image intensity supplied to the SLM, $\alpha$ represents a constant CCD noise term, and $\beta\gamma$ and $\beta\delta$ offer a single description of the SLM function; respectively scaling and additive leakage. Note that the additive terms improve upon the direct $A^2_m$ model, by allowing a positive output at the CCD given a zero input on the SLM which, although non-ideal, is observed experimentally.

Equation 16 contains the term $A^2_m$ which could be given by equation 10 as before. However, an intensity dependent record-erase model is:

$$A_m = A_s(1-\exp(-I_m t_m/I_s \tau_r))\exp-\sum_{n=m+1}^{M} I_n t_n / I_s \tau_e \tag{17}$$

where the exposure times now have been replaced by intensity-time products $I_m t_m$, which may be regarded as energy deliveries rather than just exposure duration; and $I_s$ is some analogous saturation intensity constant property of the material. A reasonable assumption for what the $I_m$ should be is the intensities of the light incident on the crystal; i.e. spatial rms intensity of the beam coming from the SLM, not the nominal $U_m$ file intensities put on the SLM. One deficiency of this model is that it does not explicitly consider the relatively larger laser power during writing than reading.

The following graph shows a fit of the parameters: The impulses indicate the measured data; the smoothly decreasing line shows the basic model of equation 10; the jagged line indicates the fitted curve derived from measured intensities (0 for black images, 255 for white, and the rms intensity for the face images) in equation 16 and 17.

The rms of the smooth curve is 12.6, that of the jagged one is 7.6. The parameters values obtained were $\alpha=24.27$, $\beta=23.6$, $\gamma=0.0026$, $A_s=2.05$, $\tau_r=5.1s$, $\tau_e=14100s$ and $I_s=148$. Note that these values can be employed in this alternative formulation to again yield an exposure schedule that will provide a uniform $A_m$, analogously to equation 15 thus:

$$t_{M-k} = -\tau_r I_s \log\left(1 - \frac{1-\exp(-I_M T/I_s \tau_r)}{\exp\left(\sum_{n=M-k+1}^{M} -I_n t_n/I_s \tau_e\right)}\right) \tag{18}$$

Limitations

Some limitations regarding use of the above-mentioned new models will now be discussed with solutions for overcoming such limitations.

The parameters of the fitted models may not be in the range that would be expected for the given components. For example the power consistent in Model C, the best model, is greater than 2, whereas the result would typically be expected to be ~0.75. The solutions are to use more data, more tightly constrained models, and more rigorous fitting methods.

The model is insensitive to the gaussian beam parameters; $\sigma_x$ and $\sigma_y$ have only a small effect on the result. One solution is to use uniform greyscale data and specifically subtract the fringe patterns.

The aperture black border visible in the corners of the output images tends to decrease the $\sigma$ values more than is probably present in beam profile. The proper solution would be to accurately model the pupil/aperture occurrences in the system. An alternative solution is to estimate the models over a more central, smaller region of the image.

The error image (the difference between the reconstructed input and the actual input, shown at both left) shows marked edge errors, that, diagonally, are of opposite sign, suggesting a small rotation of the image somewhere along the line.

The fit of the temporal parameters $A_s$, $\tau_r$, and $\tau_e$ is approximate with large attendant error bars.

The erase-record models of equations 10 and 17 can be amended to include possible erasing effects of the reference beam rather than just the object wave.

Without further elaboration, it is believed that one skilled in the art can, using the preceding description, utilize the present invention to its fullest extent. The preceding specific embodiments are, therefore, to be construed as merely illustrative, and not limitative of the remainder of the disclosure in any way whatsoever.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A method of reducing local phase noise in holographic images stored in a holographic memory system comprising:
    storing an intensity level of a temporally stable phase-coherent white reference image having a plurality of image points in a holographic reading material;
    storing an intensity level of a temporally-stable phase-coherent black reference image having a plurality of image points, each corresponding to one of said image points of said white reference image, in said holographic reading material;
    separately recording said intensity levels of said white and black reference images into a computer memory using a charge-coupled device (CCD);
    storing a plurality of data-image points;
    using said intensity levels of said black and white image points corresponding to each of said plurality of data-image points to generate a corresponding plurality of correction factors;
    applying said correction factors to a phase-coherent data image comprised of said plurality of data-image points to form a corrected phase-coherent data image; and
    storing an intensity level of said corrected phase-coherent data image in said holographic reading material.

2. The method of claim 1 wherein said steps of generating and applying said correction factors employ a simple model to provide said corrected phase-coherent data image.

3. A method according to claim 2, wherein said simple model is defined by $$s(x, y) = \frac{I(x, y) - I_{\min}(x, y)}{I_{\max}(x, y) - I_{\min}(x, y)} (s_{\max}(x, y) - s_{\min}(x, y)),$$

wherein (x,y) represents the Cartesian coordinate of each pixel of a Charge-Coupled Device (CCD) detector array of said holographic memory system, s is a corrected signal having reduced noise, I is an image-specific intensity value outputted from said CCD detector array, $S_{min}$ is a signal representing said black reference image, $I_{min}$ is an intensity signal outputted from said CCD detector array for said $S_{min}$ detected by said CCD detector array, $S_{max}$ is a signal representing said white reference image, and $I_{max}$ is an intensity signal outputted from said CCD detector array for said $S_{max}$ detected by said CCD detector array.

4. A method according to claim 3, wherein said black reference image is uniformly black, and said white reference image is uniformly white.

5. The method according to claim 3, wherein $S_{min}$ has a value of 0 and $S_{max}$ has a value of 255.

6. The method of claim 1 wherein said holographic reading material is comprised in a volume holographic recording system.

7. The method of claim 6 wherein the volume holographic recording system employs an angular multiplexing technique.

8. The method of claim 1 wherein said method is applied to a series of data images.

9. The method of claim 1 wherein said steps of generating and applying said correction factors employ a linear mapping model to provide at least one corrected data image substantially free of local phase noise, said linear mapping model being:

$$V(m, n) = \frac{V_w(m, n) - (V_b(m, n)}{K} U(m, n) + V_b(m, n)$$

wherein V(m,n) is an observed output image obtained from an input U(m,n) image, K is constant representing the number of grayscale levels, $V_w(m, n)$ is a white reference image, $V_b(m,n)$ is a black reference image, and m and n are the dimensions of an image.

10. The method according to claim 9, wherein said constant K has a value of 255.

11. The method of claim 1 wherein said steps of generating and applying said correction factors employ a linear mapping model having multiplicative gain and additive bias to provide at least one corrected data image having reduced local noise, said linear mapping model being in the form of:

$$V(m, n) = G(m, n) - U(m, n) \frac{(W(m, n) - B(m, n))}{K} + B(m, n)$$

wherein V(m,n) is an observed output image obtained from an input U(m,n) image, K is a constant representing the number of grayscale levels, W(m,n) is a multiplicative gain image, B(m,n) is an additive bias image, G(m,n) is a beam profile or light intensity variation of a laser beam, and (m,n) represents the Cartesian coordinate of a pixel in said data image.

12. The method according to claim 11, wherein said constant K has a value of 255.

13. A method for reducing local phase noise in holographic images stored in a holographic memory system comprising:
    storing a white intensity level of a temporally stable phase-coherent white reference image having a plurality of image points in a volume holographic recording material;
    storing a black intensity level of a temporally-stable phase-coherent black reference image having a plurality of image points, each corresponding to one of said image points of said white reference image, in a volume holographic reading material;
    storing at least one phase-coherent data image comprised of a plurality of data image points in said volume holographic reading material;
    recording said intensity levels of said white and black reference images into computer memory using a charge-coupled device (CCD);
    using said intensity levels of said black and said white image points corresponding to each of said plurality of data-image points to generate a corresponding plurality of correction factors;

applying said correction factors to a phase-coherent data image comprised of said plurality of data image points, to form a corrected phase-coherent data image; and storing an intensity level of said corrected phase-coherent data image in a holographic reading material.

14. A method of claim 13 wherein said steps of generating and applying said correction factors employ a simple model to provide said corrected phase-coherent data image.

15. The method according to claim 14 wherein said simple model is defined by $$s(x, y) = \frac{I(x, y) - I_{\min}(x, y)}{K}(S_{\max}(x, y) - S_{\min}(x, y)),$$

wherein (x,y) represents the Cartesian coordinate of each pixel of a Charge-Coupled Device (CCD) detector array of said holographic memory system, s is a corrected signal having reduced noise, I is an image-specific intensity value outputted from said CCD detector array, $S_{min}$ is a signal representing said black reference image, $I_{min}$ is an intensity signal outputted from said CCD detector array for said $S_{min}$ detected by said CCD detector array, $S_{max}$ is a signal representing said white reference image, and $I_{max}$ is an intensity signal outputted from said CCD detector array for said $S_{max}$ detected by said CCD detector array.

16. The method of claim 15 wherein $S_{min}$ has a value of 0 and '$S_{max}$ has a value of 255.

17. The method of claim 13 wherein said black reference image is uniformly black and said white reference image is uniformly white.

18. The method of claim 13 wherein said holographic reading material is comprised in a volume holographic recording system.

19. The method of claim 18 wherein the volume holographic recording system employs an angular multiplexing technique.

* * * * *